United States Patent
Sautter

(10) Patent No.: US 11,919,036 B1
(45) Date of Patent: Mar. 5, 2024

(54) METHOD OF IMPROVING THE ADHESION STRENGTH OF METAL-ORGANIC INTERFACES IN ELECTRONIC DEVICES

(71) Applicant: Yield Engineering Systems, Inc., Fremont, CA (US)

(72) Inventor: Kenneth Sautter, Sunnyvale, CA (US)

(73) Assignee: YIELD ENGINEERING SYSTEMS, INC., Fremont, CA (US)

(*) Notice: Subject to any disclaimer, the term of this patent is extended or adjusted under 35 U.S.C. 154(b) by 0 days.

(21) Appl. No.: 18/232,090

(22) Filed: Aug. 9, 2023

Related U.S. Application Data

(63) Continuation-in-part of application No. 18/137,876, filed on Apr. 21, 2023, now Pat. No. 11,818,849.

(51) Int. Cl.
*B05D 1/00* (2006.01)
*B05D 3/10* (2006.01)
*H05K 3/38* (2006.01)

(52) U.S. Cl.
CPC .......... *B05D 1/60* (2013.01); *B05D 3/102* (2013.01); *H05K 3/386* (2013.01); *H05K 3/389* (2013.01); *B05D 2202/45* (2013.01); *B05D 2518/00* (2013.01); *Y10T 29/49155* (2015.01)

(58) Field of Classification Search
CPC .......... H05K 3/38; H05K 3/382; H05K 3/386; H05K 3/389; Y10T 29/49124; Y10T 29/49155
See application file for complete search history.

(56) References Cited

U.S. PATENT DOCUMENTS

| | | | | |
|---|---|---|---|---|
| 4,639,285 A * | 1/1987 | Suzuki | ............ | H05K 3/381 |
| | | | | 156/329 |
| 6,623,844 B2 * | 9/2003 | Nishimoto | ........ | H05K 3/4617 |
| | | | | 428/209 |
| 6,767,828 B2 * | 7/2004 | Andry | ............ | H01L 28/60 |
| | | | | 257/E21.174 |
| 7,557,369 B2 * | 7/2009 | Humbs | ........... | H10K 59/12 |
| | | | | 257/E39.007 |
| 8,314,340 B2 | 11/2012 | Akai et al. | | |
| 8,361,548 B2 * | 1/2013 | Moffat | ............ | B05D 1/60 |
| | | | | 427/314 |
| 8,436,252 B2 | 5/2013 | Kawano et al. | | |

(Continued)

FOREIGN PATENT DOCUMENTS

EP 2244542 B1 3/2013
JP 2006080473 A 3/2006

OTHER PUBLICATIONS

Silane Coupling Agents: Connecting Across Boundaries (3rd Edition) by Barry Arkles, Annalese Maddox, Mani Singh, Joel Zazyczny, and Janis Matisons, Copyright 2014, Gelest, Inc. • Morrisville, PA., pp. 1-76.

(Continued)

*Primary Examiner* — Peter Dungba Vo
*Assistant Examiner* — Joshua D Anderson
(74) *Attorney, Agent, or Firm* — Finnegan, Henderson Farabow, Garrett & Dunner, LLP

(57) ABSTRACT

A method of improving the adhesion of a metal-organic interface in an electronic device includes providing a substrate with a metal structure, treating a surface of the metal structure to form a monolayer coating of a selected chemical composition on the surface, and coating the treated surface with an organic material.

15 Claims, 3 Drawing Sheets

(56) References Cited

U.S. PATENT DOCUMENTS

| | | |
|---|---|---|
| 8,633,400 B2 | 1/2014 | Akai et al. |
| 9,362,231 B2 | 6/2016 | Chiang et al. |
| 9,955,583 B2 | 4/2018 | Ishii et al. |
| 10,123,433 B2 | 11/2018 | Moriyama et al. |
| 2004/0112755 A1 | 6/2004 | Czeczka et al. |
| 2006/0032329 A1 | 2/2006 | Rubenstein et al. |
| 2006/0093838 A1* | 5/2006 | Kohayashi .............. C23C 28/36 427/248.1 |
| 2006/0254502 A1 | 11/2006 | Garrou et al. |
| 2007/0023908 A1 | 2/2007 | Fork et al. |
| 2008/0113178 A1 | 5/2008 | Lazovsky |
| 2009/0305226 A1 | 12/2009 | Sinesky et al. |
| 2010/0113264 A1 | 5/2010 | Tsurumi et al. |
| 2011/0168430 A1* | 7/2011 | Hata ...................... H05K 3/389 174/126.1 |
| 2011/0197369 A1 | 8/2011 | Hinestroza et al. |
| 2011/0197782 A1 | 8/2011 | Wang et al. |
| 2011/0252580 A1 | 10/2011 | Miller et al. |
| 2012/0037312 A1 | 2/2012 | Sparing et al. |
| 2014/0370313 A1 | 12/2014 | Thomas et al. |
| 2021/0111025 A1 | 4/2021 | Zyulkov et al. |

OTHER PUBLICATIONS

Improvement of the Adhesion Strength Between Copper Plated Layer and Resin Substrate Using a Chemically Adsorbed Monolayer by K. Tsuchiya, T. Ohtake, and K. Ogawa, Owned by the authors, published by EDP Scient, 2013, MATEC Web of Conferences 4, 05004 (2013), DOI: 10.1051/mateconf/20130405004 , 4 pages.

Improvements of the Epoxy-Copper Adhesion for Microelectronic Application by Lerys Granado, Stefan Kempa, Laurence John Gregoriades, Frank Burning, Tobias Bernhard, Valerie Flaud, Erick Ahnglaret, and Nicole Frety, ResearchGate: http://www.researchgate.net/publication/334228540, Article in ACS Applied Electronic Materials, Jul. 2019, DOI: 10.1021/acsaelm.9b00290, 23 pages.

* cited by examiner

US 11,919,036 B1

METHOD OF IMPROVING THE ADHESION STRENGTH OF METAL-ORGANIC INTERFACES IN ELECTRONIC DEVICES

CROSS-REFERENCE TO RELATED APPLICATIONS

This application is a continuation-in-part application of U.S. patent application Ser. No. 18/137,876, filed Apr. 21, 2023, which is incorporated herein in its entirety.

TECHNICAL FIELD

The present disclosure relates to improves adhesion strength of metal-organic interfaces in an electronic device.

BACKGROUND

The fabrication process of electronic (or photonic) devices is composed of many sequential steps to produce circuits on a wafer or a panel (collectively referred to herein as a substrate) of a material (e.g., semiconductor wafers, glass panels, printed circuit board, organic/ceramic substrates, etc.). Defects of any source introduced during the fabrication process reduces yield of the resulting devices. One cause of defects results from inadequate adhesion at metal-organic interfaces of the device. An electronic device (e.g., package substrate, integrated circuit chip, optoelectronic devices, etc.) includes numerous metal-organic interfaces. Adhesion between the metal component (e.g., interconnect, landing pad, via, etc.) and the organic component (e.g., dielectric material, molding compound, underfill material, etc.) at a metal-organic interface may be compromised for many reasons. For example, the quality/structure of the materials at the interface, embedded particles/residue on the interface (debris, chemicals, etc.), high thermo-mechanical interfacial forces (e.g., due to CTE mismatch), etc. Poor adhesion between the metal (e.g., copper pad) and the organic (e.g., dielectric) at an interface may introduce defects (e.g., delamination, cracks, etc.) at the interface and lead to reduced yield and/or reliability of the device. A strong metal-organic interface ensures that downstream processes (e.g., chemicals and/or process conditions used during downstream processes) do not deteriorate the adhesion strength of interface. Moreover, miniaturization of electronic devices requires miniaturization of integrated-circuit (IC) substrates (e.g., Printed Circuit Board (PCB)) consisting of layers of organic material (commonly referred to as build-up layers or dielectric layers comprising, for example, polymers, build up layers, etc.) and metal (e.g., copper, aluminum, gold, etc.) layers (e.g., coatings, lines, planes, vias, etc.). To manufacture fine copper circuitry with small line and space widths for next generation electronic devices, the adhesion between the copper and the organic layer needs to be increased.

Current adhesion improvement methods rely on surface roughening a metal surface to allow an overlapping dielectric layer to mechanically interlock with the metal surface and improve adhesion. For example, the surface of the metal interconnect is modified by, for example, etching, plasma ablation, etc. prior to depositing the dielectric layer to improve the adhesion between the metal and dielectric. However, such surface roughening may detrimentally affect the electrical performance of the electronic device and/or result in reliability issues. For example, high-frequency applications may require a low surface roughness, etching/ablation may require additional cleaning steps and/or cause debris from the roughening process to redeposit and be embedded on the interface. The systems and methods of improving adhesion of the current disclosure may alleviate at least some of the above-described deficiencies. However, the scope of the current disclosure is defined by the claims and not by the ability to solve any problem.

SUMMARY

Electronic devices with improved interfacial adhesion strength at metal-organic interfaces and methods for improving the interfacial adhesion strength are disclosed.

In one embodiment, a method of improving the adhesion of a metal-organic interface in an electronic device is disclosed. The method includes providing a substrate with a metal structure formed thereon, treating a surface of the metal structure with a vapor of a chemical composition to form a monolayer coating of the chemical composition on the surface of the metal structure, wherein the chemical composition includes at least one of (i.) Phosphoric Acid 2-hydroxyethyl methacrylate ester, (ii.) Vinyl Phosphonic Acid, (iii.) N-[3-(Dimethylamino)propyl]methacrylamide, (iv.) 2-(Diethylamino)ethyl methacrylate, (v.) 2-(Dimethylamino)ethyl methacrylate, (vi.) 2-Aminoethyl methacrylate hydrochloride, or (vii.) 2,3-Epoxypropyl methacrylate. And after treating the surface of the metal structure, coating the treated surface with an organic material. Wherein, the metal-organic interface between the treated surface of the metal structure and the coated organic layer has improved adhesion In another embodiment, a method of improving the adhesion of a metal-organic interface in an electronic device is disclosed. The method includes providing a substrate with a copper interconnect structure, and treating a surface of the copper interconnect structure with a vapor of a chemical composition to form a monolayer coating of the chemical composition on the surface of the copper interconnect structure, wherein the chemical composition includes at least one of (i.) Phosphoric Acid 2-hydroxyethyl methacrylate ester, (ii.) Vinyl Phosphonic Acid, (iii.) N-[3-(Dimethylamino)propyl]methacrylamide, (iv.) 2-(Diethylamino)ethyl methacrylate, (v.) 2-(Dimethylamino)ethyl methacrylate, (vi.) 2-Aminoethyl methacrylate hydrochloride, or (vii.) 2,3-Epoxypropyl methacrylate. The method may also include, after treating the surface of the copper interconnect structure, coating the treated surface with Parylene. Wherein the metal-organic interface between the treated surface of the copper interconnect structure and the coated Parylene has improved adhesion.

In yet another embodiment, an electronic device having a metal-organic interface is disclosed. The device may include a substrate with a metal structure, and a monolayer coating of a chemical composition formed on a surface of the metal structure. The chemical composition may include at least one of (i.) Phosphoric Acid 2-hydroxyethyl methacrylate ester, (ii.) Vinyl Phosphonic Acid, (iii.) N-[3-(Dimethylamino)propyl]methacrylamide, (iv.) 2-(Diethylamino)ethyl methacrylate, (v.) 2-(Dimethylamino)ethyl methacrylate, (vi.) 2-Aminoethyl methacrylate hydrochloride, or (vii.) 2,3-Epoxypropyl methacrylate. The device may also include an organic material layer disposed on the monolayer coating of the chemical composition.

BRIEF DESCRIPTION OF THE DRAWINGS

The accompanying drawings, which are incorporated herein and constitute a part of this disclosure, illustrate exemplary embodiments and, together with the description, are used to explain the disclosed principles. In these drawings, where appropriate, reference numerals that illustrate the same or similar structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure of the various described embodiments. Details of well-known components or features may be omitted to avoid obscuring other features, since these omitted features are well-known to those of ordinary skill in the art. Further, features in the figures are not necessarily drawn to scale. The dimensions of some features may be exaggerated relative to other features (for example, see FIG. 3B) to improve understanding of the exemplary embodiments. One skilled in the art would appreciate that the features in the figures are not necessarily drawn to scale and, unless indicated otherwise, should not be viewed as representing dimensions or proportional relationships between different features in a figure. Additionally, even if it is not expressly mentioned, aspects described with reference to one embodiment or figure may also be applicable to, and may be used with, other embodiments or figures.

DETAILED DESCRIPTION

All relative terms such as "about," "substantially," "approximately," etc., indicate a possible variation of ±10% (unless noted otherwise or another degree of variation is specified). For example, a feature disclosed as being about "t" units thick (or length, width, depth, etc.) may vary in thickness from (t−0.1 t) to (t+0.1 t) units. In some cases, the specification also provides context to some of the relative terms used. For example, a structure (e.g., a coating edge) described as being substantially flat may deviate by ±10% from being perfectly flat. Further, a range described as varying from, or between, 5 to 10 (5-10), includes the endpoints (i.e., 5 and 10). Moreover, as used herein, a composition that includes at least one of A, B, or C is used to refer to a composition that includes one or more of A, B, or C. For example, a composition that includes only A, a composition that includes only B, a composition that includes only C, a composition that includes both A and B, a composition that includes both A and C, a composition that includes A, B, and C, etc.

Unless otherwise defined, all terms of art, notations, and other scientific terms or terminology used herein have the same meaning as commonly understood by persons of ordinary skill in the art to which this disclosure belongs. Some components, structures, and/or processes described or referenced herein are well understood and commonly employed using conventional methodology by those skilled in the art. These components, structures, and processes will not be described in detail. All patents, applications, published applications and other publications referred to herein as being incorporated by reference are incorporated by reference in their entirety. If a definition or description set forth in this disclosure is contrary to, or otherwise inconsistent with, a definition and/or description in these references, the definition and/or description set forth in this disclosure controls over those in references incorporated by reference. None of the references described or referenced herein is admitted as prior art relative to the current disclosure. It should be noted that, in this disclosure, the term "electronic device" is used to cover all components and electronic/photonic assemblies (e.g., package substrate, printed circuit board, interposer, integrated circuit chip, etc.).

Figure 1A:
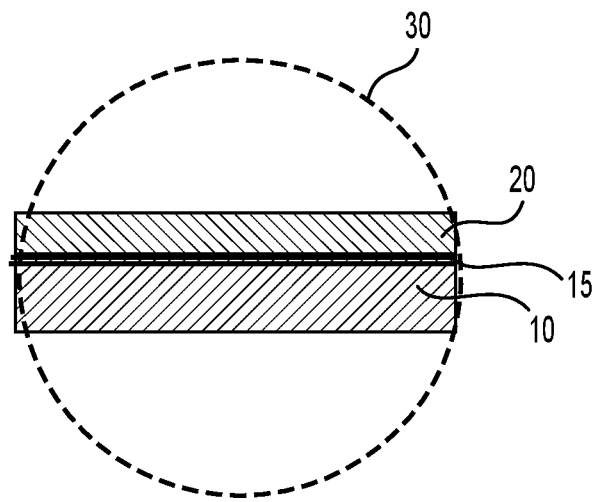
FIG. 1A is a simplified schematic illustration of a metal-organic interface in an electronic device.

The discussion below describes an exemplary method to improve the interfacial adhesion strength of a metal-organic interface in an electronic device and the resulting electronic device with improved interfacial adhesion strength. FIG. 1A is a simplified representation of a metal-organic interface 30 of an exemplary electronic device illustrated in FIG. 1B. Interface 30 includes a metal structure 10 (e.g., coating, line, plane, pad, via wall, etc.) with an organic layer 20 formed on one of its surfaces. In electronic devices of the current disclosure, a monolayer coating 15 of a chemical composition formed at the interface between the metal structure 10 and the organic layer 20 improves the adhesion strength of the metal-organic interface. Organic layer 20 may be formed on metal structure 10 by any known method used in the fabrication of electronic devices (e.g., deposition, plating, growing, spraying, etc.). In an exemplary embodiment, metal-organic interface 30 of FIG. 1A may an interface of an exemplary package substrate 40 that represents the electronic device of FIG. 1B. Package substrate 40 is an 8 layer High Density Interconnect (HDI) substrate with two build-up layers 34 on each side of core stack 32 having 4 circuit layers (referred to as a 2+4+2 (2 build-up+4 core layers+2 build-up layers) stack). The core stack 32 may be made of a BT (bismaleimide triazine) epoxy with embedded glass fibers that separate the copper interconnect lines and plated through hole (PTH) vias of the core. The build-up layers 34 on either side of the core stack 32 may also include an organic dielectric material (such as Parylene) that separate the copper interconnect structures (e.g., interconnect lines, inter-layer vias, bond pads, etc.) in these layers. In some embodiments, the BT epoxy core stack 32 may be fabricated first and then build-up layers 34 may be sequentially formed (e.g., by depositing, photo-lithographic patterning, etching, etc.) and on the top and bottom. As illustrated by the dashed line circles in FIGS. 1A and 1B, the metal-organic interface 30 of FIG. 1A may be an interface located anywhere on package substrate 40. Although interface 30 is described as being part of a package substrate 40, as explained previously, the interface 30 can be a part of any electronic device. For example, on the back end structure of an IC die, etc.

Figure 1B:
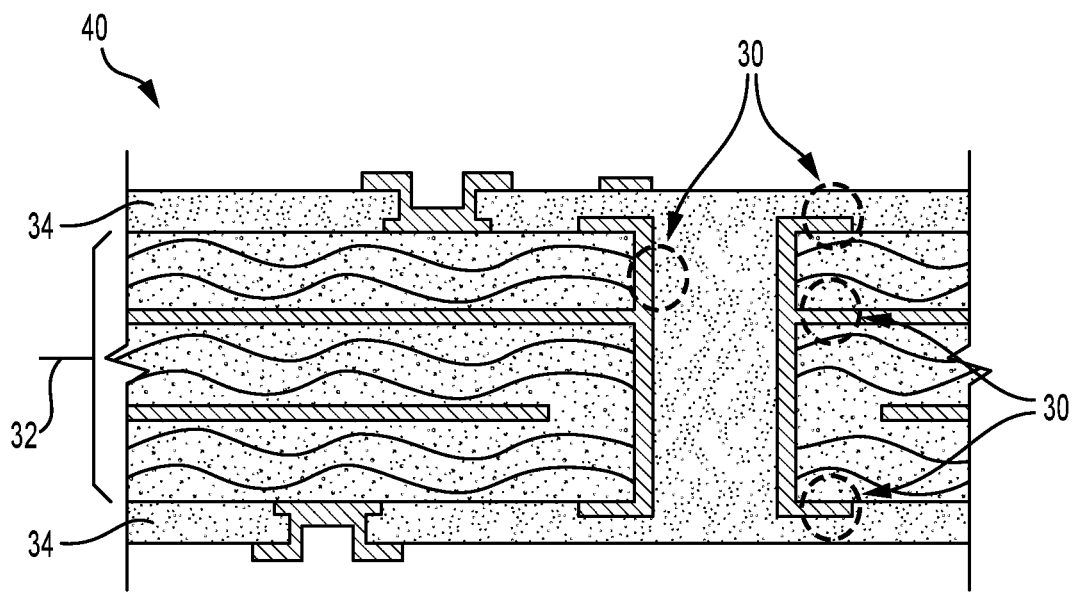
FIG. 1B is a schematic cross-sectional view of an exemplary electronic device that includes the interface of FIG. 1A.

In the embodiment illustrated in FIGS. 1A and 1B, the material of metal structure 10 is the electrically conductive interconnect material (e.g., copper, etc.). The material of organic layer 20 depends on the location of interface 30 in package substrate 40. For example, if interface 30 is an interface in the core stack 32, organic layer 20 may be an organic material used in the core (e.g., BT epoxy, etc.). And if interface 30 is an interface in a build-up layer 34, organic layer 20 may be an organic material used in the build-up layer (e.g., Parylene, ABF, or any other suitable organic material). For the sake of brevity, improving the adhesion strength of a copper-Parylene interface will be described herein. In other words, in the discussion below, metal structure 10 is made of (or includes) copper and the organic layer 20 is made of (or includes) Parylene. Parylene is a generic term for a series of polymers with the chemical formula (C8H8)n, where n represents the number of repeating monomer units. It should be noted that these materials (e.g., copper and Parylene) are only exemplary. In general, organic layer 20 may include any material such as, for example, polymer, dielectric, epoxy (e.g., underfill epoxy, over mold epoxy, etc.), or a composite material consisting of two or more of the above materials. For example, a composite of glass fiber, epoxy resign and silica filler material with a layer of copper on top, commonly called copper clad laminate, etc. And, metal structure 10 may include any metal or alloy, such as, for example, copper, gold, titanium, aluminum, etc. Moreover, metal structure 10 of interface 30 may be any portion of the interconnect structure (e.g., interconnect line, power plane, ground plane, inter-layer via, PTH, bond pad, etc.) on package substrate 40.

With reference to FIG. 1A, in the methods of the current disclosure, after the metal structure 10 is formed by any suitable method, prior to forming the organic layer 20 on a surface of the metal structure 10 (e.g., by depositing a layer of the organic material), the surface of the metal layer is treated with a chemical composition. The chemical composition reacts with the metal and forms a monolayer coating 15 of the chemical composition (e.g., a thin layer of a reaction compound) on the surface of the metal structure 10. This monolayer coating 15 of the chemical composition increases the adhesion of the organic layer 20 that is then formed (e.g., deposited) on the metal structure 10 atop the monolayer coating 15. It should be noted that, when the metal surface is treated with the chemical composition, in some cases, the chemical composition itself may not deposit on the surface to form the monolayer coating. Instead, the chemical composition may react with the metal surface to form the monolayer coating, where the functional part of the chemical composition forms, or is included in, the monolayer coating. Moreover, as a person of ordinary skill in the art would recognize, the coating material may react with the substrate material (e.g., substrate metal) and change in composition over time. It should be noted that, as used herein, the term "monolayer coating of the chemical composition" is used to refer to all the above described scenarios. In other words, the term "monolayer coating of the chemical composition" broadly refers to a monolayer coating having (a) a composition made substantially of the chemical composition (that the substrate is treated with), (b) a composition that includes the functional part of the chemical composition, and (c) a composition that is the product of a chemical reaction between the chemical composition and the substrate material. In some embodiments, energy dispersive spectroscopy (EDS) or other known techniques may be used to determine the composition of the monolayer coating 15. A "monolayer coating" refers to a single layer of molecules or atoms that are deposited onto a surface to form a uniform and thin coating. This type of coating is extremely thin, typically on the nanometer scale, and consists of a tightly packed, self-assembled layer of molecules or atoms. When the metal surface is treated with the chemical composition, the molecules or atoms may organize themselves into a uniform layer due to intermolecular forces.

Metal structure 10 may be formed by any process (e.g., IC fabrication process) used to form metal structures on an underlying substrate. For example, one exemplary process of forming metal structure 10 on an underlying substrate (e.g., core stack 32 of FIG. 1B) may include depositing (e.g., by chemical vapor deposition (CVD), etc.) a layer of a metal (e.g., copper) on the substrate and patterning the metal layer into the desired circuit pattern using conventional photolithographic processes. The organic layer 20 may also be formed atop the metal structure 10 by any known process (e.g., deposition, plating, spraying, etc.) used in the fabrication of package substrate 40. Prior to forming the organic layer 20, a monolayer coating 15 of the chemical composition is formed, or deposited, on the surface of the metal structure, for example, by vapor phase deposition. In general, the monolayer coating 15 may be about 1-30 Angstroms thick. In some embodiments, the monolayer coating 15 may be between about 1-10 Angstroms thick. It should be noted that that the "thickness" of a monolayer may be the length of a molecule of the chemical composition. It should be noted that the monolayer coating 15 may not entirely cover the treated metal surface. Instead, there may be regions with no monolayer coating (or minimal coating) on the metal surface. In other words, the coverage of the monolayer coating on the substrate may not be 100%. If a measurement technique such as ellipsometry is used to measure the "thickness" of the monolayer coating, the derived thickness may be between 0-100% of the length of the molecule, depending on the percentage coverage of the monolayer coating on the substrate.

Vapor phase deposition is a controlled process that may provide a stable environment for forming a uniform self-assembled monolayer coating 15 of the chemical composition on the surface of the metal structure 10. The monolayer coating 15 may provide reactivity and functionality to the surface of the metal structure 10 by creating a durable and covalent bond between the functionalized part of the chemical composition and the underlying metal structure 10. As known to persons skilled in the art, the physical and chemical properties of a solid surface are largely determined by the outmost layer of atoms or chemical groups. As a result, coating the surface of metal structure 10 with a monolayer coating 15 of the chemical composition may allow the metal structure 10 to form a strong bond with the molecules of the organic layer 20 that will be deposited (or otherwise formed) thereon. Although surface modification of metal surfaces is known (see, e.g., Sagiv; J. Am. Chem. Soc.; Jan. 1, 1980; 102; pp. 92-98), successful coupling agents for metals that form hydrolytically or mechanically unstable surfaces oxides were not previously disclosed. Suitable chemical compositions for bonding between a metal surface and an organic layer have also not been previously disclosed.

The chemical compositions used to treat the metal surface in the current disclosure are suitable coupling agents to increase the adhesion of the organic material to the mechanically unstable metal surfaces (e.g., electroless copper, Physical Vapor Deposited (PVD) copper, electroplated copper, electroplated gold, PVD gold, etc.) in metal-organic interfaces. The disclosed chemistries are based on the chemical nature of the substrates. The chemical compositions allows for a multitude of metal substrates to be coated on both smooth and rough surfaces and provide excellent post deposition film stability. The functionalized and reactive groups of selected chemical compositions allow for a variety of bonding mechanisms for the metal and organic to bond to. The disclosed chemical compositions increase the bond strength between Parylene and copper structures on substrates. These bonds are expected to anchor between the functionalized groups of the chemical composition and the metal surfaces as well as create in plane cross linking which increases stability of the monolayer stability.

Table 1 lists some of the chemical compositions that may be used as effective coupling agents for metal-organic interfaces (interface 30 of FIG. 1A). These compositions may be especially suitable to increase the adhesion of organic materials (such as, for example, Parylene) to surfaces of copper metal structures 10 formed by different processes, such as, for example, electroless copper, physical vapor deposited (PVD) copper, electroplated copper, etc. It should be noted that the list in Table 1 is not an exhaustive list and suitable chemical compositions of the current disclosure may include other similar compositions. In general, the selected chemical composition may have a boiling point below about 250° C. at a pressure between about 0.1-10 Torr.

on the treated metal surfaces that increases the adhesion strength of the interface 30 when an organic material 20 is deposited on the treated surfaces. In vapor phase the process works with individual molecules and forms an ultrathin monolayer coating 15 of the chemical composition on the metal structure 10. The above-described chemical compositions have been selected such that they will not react head to tail and therefore will not polymerize and form thick layers. With some chemistries, in liquid phase, the chemicals may have a tendency to clump together and form uneven layers. Vapor phase deposition has the additional benefit of being able to diffuse through small openings as device features reduce in size.

TABLE 1

Exemplary chemical compositions to improve adhesion of metal-organic interfaces.

| | | |
|---|---|---|
| 1 | Phosphoric Acid 2-hydroxyethyl methacrylate ester CAS# [52628-03-2] | 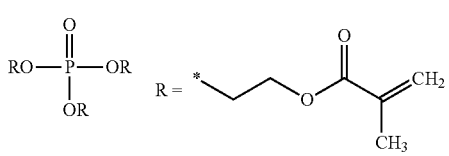 |
| 2 | Vinyl Phosphonic Acid CAS# [1746-03-8] | 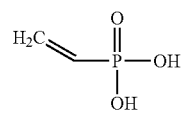 |
| 3 | N-[3-(Dimethylamino)propyl] methacrylamide CAS# [5205-93-6] | 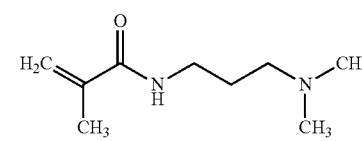 |
| 4 | 2-(Diethylamino)ethyl methacrylate CAS# [105-16-8] | 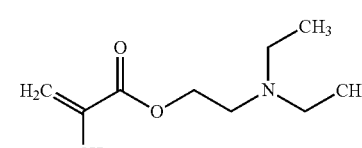 |
| 5 | 2-(Dimethylamino)ethyl methacrylate CAS# [2867-47-2] | 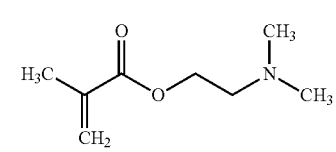 |
| 6 | 2-Aminoethyl methacrylate hydrochloride CAS# [2420-94-2] | 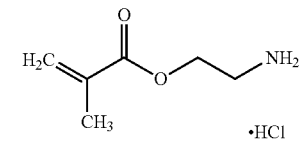 |
| 7 | 2,3-Epoxypropyl methacrylate CAS # [106-91-2] | 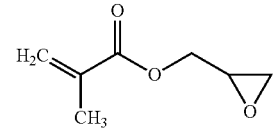 |

It was determined that treating the surfaces of the metal structures 10 using a vapor of at least one of the above-described chemical compositions by vapor phase deposition creates a monolayer coating 15 of the chemical composition The particular chemical composition(s) selected for any application depends on the materials that form the interface, process conditions, etc. For example, the materials that constitute the metal structure 10 and organic layer 20, the process conditions, etc. It was determined that the above-disclosed chemical compositions are effective to improve the adhesion of both smooth and rough surfaces and provide good post deposition film stability. Although the disclosed chemical compositions are expected to be suitable for a wide variety of materials used as metal structures 10 and organic layers 20 in electronic devices, they were determined to be especially effective for increasing the adhesion between organic layers 20 comprising Parylene and metal structures 10 comprising copper. These chemical compositions are also expected to be effective to increase the adhesion strength between any metal with an unstable oxide and a polyamide. It is believed that the functionalized and reactive groups of the disclosed chemical compositions will allow for a variety of bonding mechanisms between the metal structure 10 and the organic layer 20. The formed bonds are expected to anchor between the functionalized groups of the chemical composition and the metal surfaces as well as facilitate in plane cross linking which increases monolayer stability.

In some embodiments, the surface of the metal structure 10 may be treated with one or more of the above-described chemical compositions using a vapor phase deposition process. In some embodiments of an exemplary vapor phase deposition process, a vapor of the desired chemical composition is introduced into a process chamber that supports therein a substrate (e.g., package substrate 40 of FIG. 1B) with an exposed metal structure 10. The process chamber of any suitable semiconductor process apparatus may be used for the vapor phase silane deposition process. For example, the process chamber of the process apparatus described in any of U.S. Pat. Nos. 7,727,588; 8,252,375; 8,361,548; 10,147,617; 10,319,612; 10,490,431; 11,367,640; 11,444,053; 11,335,662; 11,296,049; 11,456,274; and 11,465,225 may be used. Each of these references is incorporated in its entirety herein. In some embodiments, the temperature and pressure of the vapor in the process chamber may be adjusted to keep the applied chemical composition in its vapor phase. The exact values (or ranges) of temperature and pressure to keep the chemical composition in its vapor phase depends on the applied composition and the application (e.g., the materials involved, etc.). In general, the metal structure 10 may be exposed to the vapor for any desired time (e.g., from about 3 minutes-2 hours). In some embodiments, the metal structure 10 may be exposed to the vapor of the chemical composition for a period or time between about 10-30 mins, or about 15-20 mins. It some embodiments, a longer time may be used. A monolayer coating 15 of the chemical composition may be formed during the initial stages (e.g., first 10-20 mins) of exposure. Increasing the exposure time may increase the density of the formed monolayer coating 15.

Figure 2A:
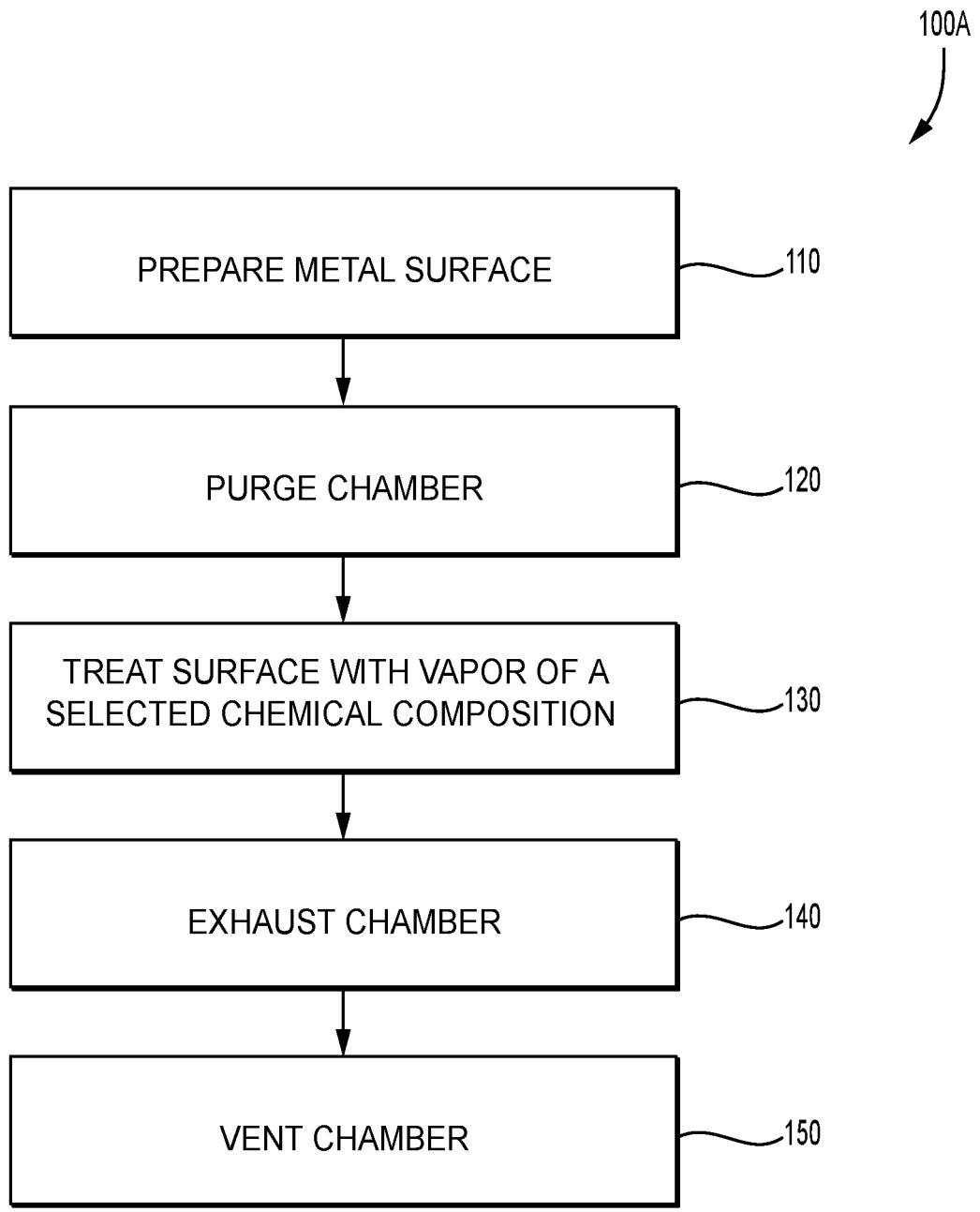
FIG. 2A is a flow chart of an exemplary method of treating the metal surface in the metal-oxide interface of FIG. 1A.

FIG. 2A is a flow chart of an exemplary process 100A that may be used to treat a substrate with the metal structure 10 formed thereon. One or more substrates with the metal structure 10 may be placed in a process chamber. The surface of the metal structure 10 and/or the substrate may be prepared for vapor treatment (step 110). In some embodiments, the surface preparation may include a wet process, such as, for example, a dilute acid bath or exposing the surface to a dry active plasma to remove contaminants and native oxide from the surface. The process chamber may then be purged to remove oxygen and moisture (step 120). In some embodiments, as described in more detail in, for example, U.S. Pat. Nos. 7,727,588 and 8,252,375, the process chamber may be subjected to one or more successive vacuum and nitrogen purge cycles to create a relatively oxygen and moisture free environment in the process chamber. In some embodiments, heated nitrogen gas may be used. For example, in some embodiments, the process chamber may be subject to vacuum (e.g., about 10 Torr for 2 minutes, etc.) and then to room temperature nitrogen gas or heated nitrogen gas (e.g., at 150° C.), either once or multiple times to remove moisture and oxygen from the chamber. If heated nitrogen gas is used, the pre-heated nitrogen gas may also warm the surface of the substrate. In embodiments where it is desirable to not heat the substrate before the oxygen level is reduced to be below an acceptable level (e.g., <100 ppm), room temperature (or cooled) nitrogen gas may be used. Vapor of the desired chemical composition (e.g., a composition listed in Table 1) may then be admitted into the process chamber (step 130). The chemical vapor injected into the chamber may be vaporized from a chemical composition liquid and then admitted into the process chamber or may be transported via inert carrier gas (such as, e.g., nitrogen). For example, heated nitrogen gas may be bubbled through the chemical composition liquid and then admitted into the process chamber. In some embodiments, the chemical composition vapor of step 130 may be vaporized from pure liquid chemistry or may be vaporized from a solid or semi-solid chemistry. As explained previously, exposure time of the chemical composition vapor to the substrate may be varied depending on the reaction rate of the substrate to achieve a dense monolayer film. The temperature and pressure of the chamber may also be adjusted to keep the chemical composition in vapor phase. After the metal structure 10 is exposed to the chemical composition vapor for a sufficient time, the chamber may be evacuated to remove excess chemical vapor from the chamber (step 140). In some embodiments, similar to step 120, the process chamber may be alternately subject to vacuum and nitrogen gas one or more times to completely remove the chemical vapor from the chamber. In some embodiments, the chamber may then be vented to the atmosphere (step 150). After the metal structure 10 is treated with the chemical composition vapor, the organic layer 20 may be formed atop the treated metal structure 10 by any suitable process known in the art (e.g., deposition, etc.). In some embodiments, a conformal coating of the organic layer 20 may be deposited on the substrate surface with the metal structure 10. Treating the surface of the metal structure with chemical composition vapor in step 130 creates a monolayer coating 15 of the chemical composition on the surface that increases the adhesion of the organic layer to the metal surface.

Figure 2B:
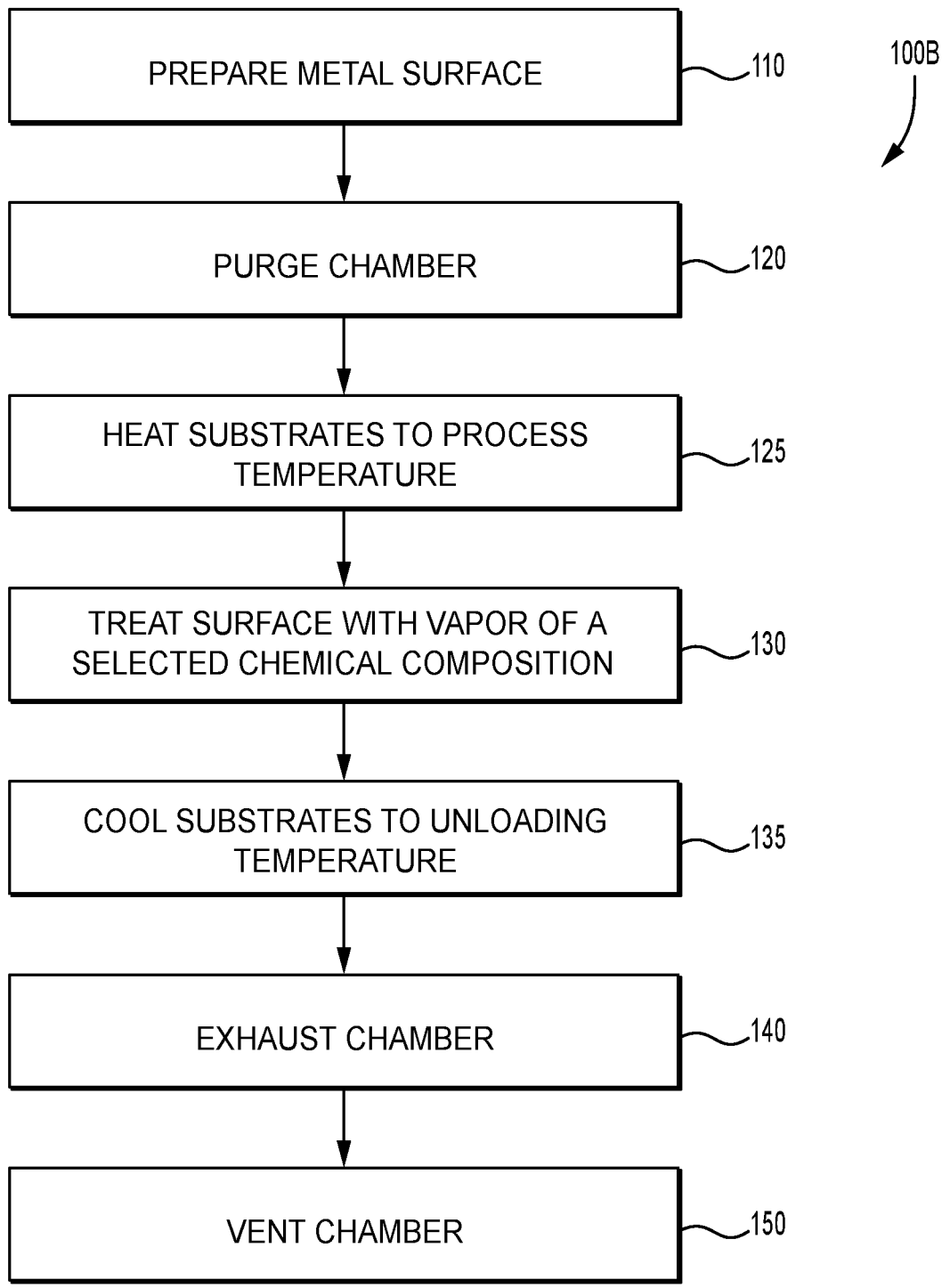
FIG. 2B is a flow chart of another exemplary method of treating the metal surface in the metal-oxide interface of FIG. 1A.

In some embodiments, the process of FIG. 2A may be used in process apparatuses which have a preheated chamber. In other embodiments of process apparatuses, the process chamber and/or the substrate may be heated from room temperature to process temperature before exposure to the chemical composition vapor (step 130) and then cooled down to a temperature safe for exposure to atmospheric oxygen (typically <100 C). Such a process may be used to treat metals (e.g., copper) that are sensitive to oxygen. FIG. 2B is a flow chart of another exemplary process that may be used. Process steps of FIG. 2B that are similar to those described with reference to FIG. 2A are numbered similarly and are not described in detail. In process 100B of FIG. 2B, after purging the chamber (step 120) as described with reference to FIG. 2A, the process chamber and/or the substrates may be heated to the process temperature (step 125). The process temperature (e.g., 150° C., 175° C., 200° C., etc.) may depend on the process apparatus used. The metal surface is then treated with a vapor of the selected chemical composition (step 130). The substrates are then cooled to a safe unloading temperature of, for example, less than about 100° C. (step 135). The chamber may then be exhausted (step 140) and vented (step 150). It should be noted that the processes illustrated in FIGS. 2A and 2B are only exemplary and many modifications are possible. For example, the described steps may be performed in a different order and some steps may be eliminated. For example, in process 100B of FIG. 2B, steps 135 and 140 may be interchanged (e.g., step 140 may be performed before step 135). In some embodiments, the processes 100A and 100B may be part of a larger process. For example, in some embodiments, process 100A or 100B may be incorporated in a process used to deposit an organic material on the metal structure.

When the metal structure 10 is exposed to the chemical composition vapor in step 130, a monolayer coating 15 of the chemical composition may be formed on (or deposited on) the surface of metal structure 10. Although the monolayer coating 15 may bond with the metal structure using any mechanism, in some embodiments where metal structure 10 includes copper, the monolayer coating may bond to the metal structure 10 using one or more of the mechanisms listed in Table 2 below.

TABLE 2

Exemplary bonding mechanisms.

A    Hydrogen bonding

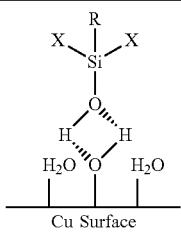

B    Covalent Bonding via surface oxides

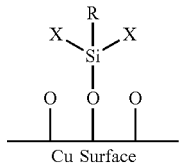

C    Chelation assisted amine bond

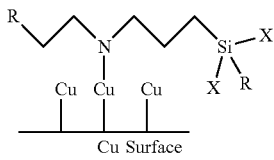

D    Coordination bond

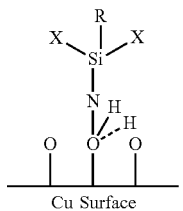

E    Direct Sulfur/ Amine bond

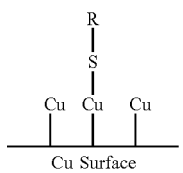

The surface of the copper metal structure 10 may be populated with Cu atoms or CuO molecules which result in the different bonding mechanisms as outlined above. The unique feature of the selected chemical compositions is that they can form covalent bonds in areas that are oxidized or chelated bonds in areas where the native oxide has been removed and only copper remains. Orientation of the molecule may change from one point to another on the surface, but the molecule will still bond. In some embodiments, each of these selected molecules will use all of the bonding mechanisms at various places on the surface.

Treating the surface of the metal structures 10 using the disclosed processes may increase the adhesion between the metal structure 10 and the organic layer 20 in an electronic device. In particular, the monolayer coating 15 of the chemical composition formed between the metal surface and the organic layer may improve the interfacial adhesion of the metal-organic interface. This improvement in adhesion may result in the reduction of (or the elimination of) post etch delamination from the top and sidewalls of metal-organic interfaces that cause interfacial failure and reliability issues in electronic devices. Since the increase in adhesion is achieved without increasing the surface roughness of the metal structure 10, signal loss may also be eliminated.

Although the disclosed process is described with reference to an electronic device, this is only exemplary. As would be recognized by persons skilled in the art, embodiments of the disclosed methods may be used in other applications also. For example, embodiments of the disclosed methods may also be used for adhesion promotion of metal-organic interfaces in devices used in drug delivery, drug absorption, gas separation, lithium-ion batteries, $CO_2$ Capture, medical sensors, biological markers, wearable devices, etc. The disclosed treatment methods may be incorporated in any suitable process apparatus (e.g., process oven, vapor deposition systems, coating machines, etc.) Furthermore, although in the description above, some process steps were disclosed with reference to specific embodiments, a person skilled in the art would recognize that this is only exemplary, and these steps are applicable to all disclosed embodiments. Other embodiments of the disclosed methods will be apparent to those skilled in the art from consideration of the disclosure herein.

What is claimed is:

1. A method of improving the adhesion of a metal-organic interface in an electronic device, comprising:
   providing a substrate with a metal structure formed thereon;
   treating a surface of the metal structure with a vapor of a chemical composition to form a monolayer coating of the chemical composition on the surface of the metal structure, wherein the chemical composition includes at least one of
   (i.) Phosphoric Acid 2-hydroxyethyl methacrylate ester,
   (ii.) Vinyl Phosphonic Acid,
   (iii.) N-[3-(Dimethylamino)propyl]methacrylamide,
   (iv.) 2-(Diethylamino)ethyl methacrylate,
   (v.) 2-(Dimethylamino)ethyl methacrylate,
   (vi.) 2-Aminoethyl methacrylate hydrochloride, or
   (vii.) 2,3-Epoxypropyl methacrylate; and
   after treating the surface of the metal structure, coating the treated surface with an organic material, wherein the metal-organic interface between the treated surface of the metal structure and the coated organic layer has improved adhesion.

2. The method of claim 1, wherein the monolayer coating of the chemical composition is about 1 to 10 Angstroms thick.

3. The method of claim 1, wherein the chemical composition has a boiling point below about 250° C. at a pressure between about 0.1-10 Torr.

4. The method of claim 1, wherein providing the substrate includes providing the substrate in a process chamber, and the method further includes purging the process chamber of oxygen or moisture prior to treating the surface of the metal structure with the vapor of the chemical composition.

5. The method of claim 4, further includes purging the process chamber of the vapor of the chemical composition after treating the surface of the metal structure with the vapor of the chemical composition.

6. The method of claim 1, wherein the metal structure includes copper.

7. The method of claim 6, wherein the organic material includes Parylene.

8. The method of claim 1, wherein the substrate is a part of a package substrate.

9. The method of claim 1, wherein the metal structure is an interconnect structure of the electronic device.

10. The method of claim 9, wherein the interconnect structure is one of an interconnect line, a power plane, a ground plane, a via, or a plated through hole.

11. A method of improving the adhesion of a metal-organic interface in an electronic device, comprising:
  providing a substrate with a copper interconnect structure;
  treating a surface of the copper interconnect structure with a vapor of a chemical composition to form a monolayer coating of the chemical composition on the surface of the copper interconnect structure, wherein the chemical composition includes at least one of
  (i.) Phosphoric Acid 2-hydroxyethyl methacrylate ester,
  (ii.) Vinyl Phosphonic Acid,
  (iii.) N-[3-(Dimethylamino)propyl]methacrylamide,
  (iv.) 2-(Diethylamino)ethyl methacrylate,
  (v.) 2-(Dimethylamino)ethyl methacrylate,
  (vi.) 2-Aminoethyl methacrylate hydrochloride, or
  (vii.) 2,3-Epoxypropyl methacrylate; and
  after treating the surface of the copper interconnect structure, coating the treated surface with Parylene, wherein the metal-organic interface between the treated surface of the copper interconnect structure and the coated Parylene has improved adhesion.

12. The method of claim 11, wherein coating the treated surface with Parylene includes depositing the Parylene on the coated surface.

13. The method of claim 11, wherein the substrate is a part of a package substrate and the copper interconnect structure is one of an interconnect line, a power plane, a ground plane, a via, or a plated through hole.

14. The method of claim 11, wherein providing the substrate includes providing the substrate in a process chamber, and the method further includes purging the process chamber of oxygen or moisture prior to treating the surface of the copper interconnect structure with the vapor of the chemical composition.

15. The method of claim 14, further includes purging the process chamber of the vapor of the chemical composition after treating the surface of the copper interconnect structure with the vapor of the chemical composition.

* * * * *